(12) United States Patent
Adachi et al.

(10) Patent No.: US 12,550,600 B2
(45) Date of Patent: Feb. 10, 2026

(54) METHOD FOR PRODUCING LIGHT-EMITTING ELEMENT, AND LIGHT-EMITTING ELEMENT

(71) Applicant: SHARP KABUSHIKI KAISHA, Sakai (JP)

(72) Inventors: Takahiro Adachi, Sakai (JP); Jun Sakuma, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 496 days.

(21) Appl. No.: 18/037,476

(22) PCT Filed: Dec. 3, 2020

(86) PCT No.: PCT/JP2020/044948
§ 371 (c)(1),
(2) Date: May 17, 2023

(87) PCT Pub. No.: WO2022/118415
PCT Pub. Date: Jun. 9, 2022

(65) Prior Publication Data
US 2023/0413656 A1    Dec. 21, 2023

(51) Int. Cl.
*H10K 71/20* (2023.01)
*H10K 50/115* (2023.01)
*H10K 59/35* (2023.01)
*H10K 102/00* (2023.01)

(52) U.S. Cl.
CPC ......... *H10K 71/221* (2023.02); *H10K 50/115* (2023.02); *H10K 59/35* (2023.02); *H10K 71/233* (2023.02); *H10K 2102/331* (2023.02)

(58) Field of Classification Search
CPC ............................ H10K 50/115; H10K 71/233
See application file for complete search history.

(56) References Cited

U.S. PATENT DOCUMENTS

| | | |
|---|---|---|
| 2004/0224263 A1 | 11/2004 | Itou |
| 2017/0136490 A1 | 5/2017 | Sanchot et al. |
| 2017/0254934 A1* | 9/2017 | Liang ................... G03F 7/20 |
| 2020/0033516 A1 | 1/2020 | Kim et al. |
| 2020/0127219 A1 | 4/2020 | Chen et al. |
| 2022/0376180 A1 | 11/2022 | Steiger et al. |

FOREIGN PATENT DOCUMENTS

| | | |
|---|---|---|
| CN | 1496666 A | 5/2004 |
| CN | 109378395 A | 2/2019 |
| EP | 3410208 A1 | 12/2018 |
| JP | 2008078590 A | 4/2008 |
| JP | 2017097348 A | 6/2017 |
| JP | 2020506442 A | 2/2020 |

* cited by examiner

*Primary Examiner* — Daniel P Shook
(74) *Attorney, Agent, or Firm* — ScienBiziP, P.C.

(57) ABSTRACT

A method for manufacturing a light-emitting element includes forming a first light-emitting layer by applying a first quantum dot solution containing first quantum dots, forming a first resist layer by applying a first photosensitive resin composition onto the first light-emitting layer, exposing the first resist layer to light in a predetermined pattern, and performing a pattern formation of developing the first resist layer with a developing solution to form a patterned first resist layer, and processing the first light-emitting layer with a treatment liquid using the patterned first resist layer as a mask to form a patterned first light-emitting layer.

13 Claims, 21 Drawing Sheets

METHOD FOR PRODUCING LIGHT-EMITTING ELEMENT, AND LIGHT-EMITTING ELEMENT

TECHNICAL FIELD

The disclosure relates to a method for manufacturing a light-emitting element and a light-emitting element.

BACKGROUND ART

PTL1, for example, discloses a method of patterning a quantum dot layer. More specifically, a photoresist layer is formed on a quantum dot layer formed on a substrate. Then, the photoresist layer is patterned through exposure and development. The quantum dot layer is patterned through etching or the like using the patterned photoresist layer as a mask. Then, the patterned photoresist layer is finally removed.

CITATION LIST

Patent Literature

PTL1: US 2017/0254934 A

SUMMARY OF INVENTION

Technical Problem

However, the patterning of the quantum dot layer described in PTL 1 includes many steps such as the step of removing the photoresist layer, and there is a possibility of a previously formed layer being damaged. A main object of the disclosure is, for example, to provide a method for manufacturing a light-emitting element that enables a quantum dot layer containing quantum dots to be more simply formed.

Solution to Problem

A method for manufacturing a light-emitting element of an aspect according to the disclosure includes forming a first light-emitting layer by applying a first quantum dot solution containing first quantum dots, forming a first resist layer by applying a first photosensitive resin composition onto the first light-emitting layer, exposing the first resist layer to light in a predetermined pattern, and performing a pattern formation of developing the first resist layer with a developing solution to form a patterned first resist layer, and processing the first light-emitting layer with a treatment liquid using the patterned first resist layer as a mask to form a patterned first light-emitting layer.

SUMMARY

A method for manufacturing a light-emitting element of another aspect according to the disclosure includes forming a lift-off resist layer by applying a positive photosensitive resin composition, exposing the lift-off resist layer to light in a predetermined pattern, developing the lift-off resist layer to form a patterned lift-off resist layer, applying a first quantum dot solution containing first quantum dots onto the patterned lift-off resist layer to form a first light-emitting layer, applying a negative photosensitive resin composition onto the first light-emitting layer to form a first resist layer, and performing a pattern formation of exposing an entire surface of the first resist layer to light, and then lifting off the first light-emitting layer and the first resist layer formed on the patterned lift-off resist layer by processing the patterned lift-off resist layer with a developing solution to pattern the first light-emitting layer and the first resist layer.

A light-emitting element of an aspect according to the disclosure includes patterned first light-emitting layers containing first quantum dots, and a resist layer formed of a cured product of a photosensitive resin composition containing a functional material, the resist layer being layered on each of the patterned first light-emitting layers.

DESCRIPTION OF EMBODIMENTS

Preferable embodiments for carrying out the disclosure will be described hereinafter. However, the following embodiments are merely illustrative. The disclosure is not limited in any way to the following embodiments.

First Embodiment

Figure 1:
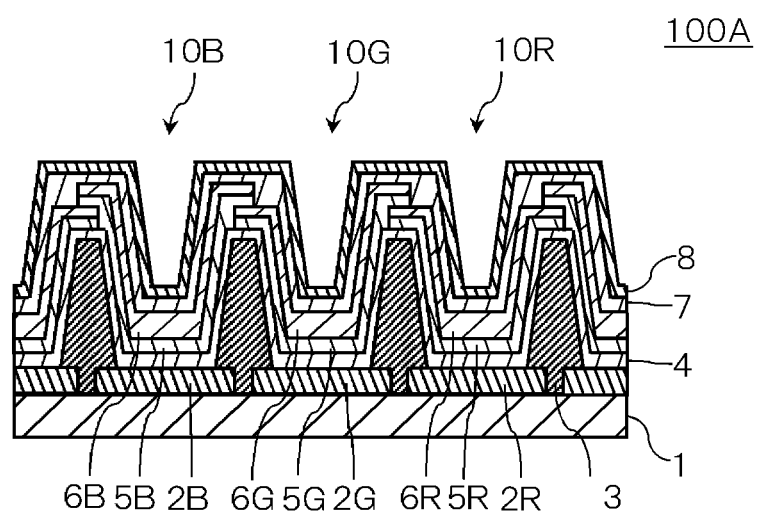
FIG. 1 is a view schematically illustrating an example of a layered structure of a light-emitting element according to a first embodiment.

FIG. 1 is a view schematically illustrating an example of a layered structure of a light-emitting element 100A according to the present embodiment.

The light-emitting element 100A is a device that emits light. The light-emitting element 100A may be, for example, an illumination device (e.g., a backlight) that emits light such as white light, or may be a display device that displays an image (including, for example, character information) by emitting light. In the present embodiment, an example in which the light-emitting element 100A is one pixel in a display device will be described. A display device can be formed, for example, by arranging a plurality of pixels in a matrix shape.

The light-emitting element 100A includes, for example, a first light-emitting element 10R that emits red light, a second light-emitting element 10G that emits green light, and a third light-emitting element 10B that emits blue light as illustrated in FIG. 1. The first light-emitting element 10R has a light-emitting central wavelength at a first wavelength and emits light at, for example, approximately 630 nm. The second light-emitting element 10G has a light-emitting central wavelength at a second wavelength shorter than the first wavelength and emits light at, for example, approximately 530 nm. The third light-emitting element 10B has a light-emitting central wavelength at a third wavelength shorter than the second wavelength and emits light at, for example, approximately 440 nm.

The first light-emitting element 10R has a structure in which a first electrode 2R, a first charge transport layer 4, a first light-emitting layer 5R, a first resist layer 6R, a second charge transport layer 7, and a second electrode 8 are layered on a substrate 1 in this order.

The substrate 1 is made of, for example, glass, and functions as a support body that supports each of the layers described above. The substrate 1 may be, for example, an array substrate on which a thin film transistor (TFT) and the like are formed.

The first electrode 2R is disposed on the substrate 1. The first electrode supplies, for example, a first charge to the first light-emitting layer 5R.

The first charge transport layer 4 is disposed on the first electrode 2R. The first charge transport layer 4 transports the first charge injected from the first electrode 2R to the first light-emitting layer 5R. Further, the first charge transport layer 4 may be composed of a single layer or multiple layers.

The first light-emitting layer 5R is disposed on the first charge transport layer 4. The first light-emitting layer 5R has a light-emitting central wavelength at the first wavelength and emits light at, for example, approximately 630 nm. For example, the first light-emitting layer 5R contains a first light-emitting material that has a light-emitting central wavelength at the first wavelength and that emits light at, for example, approximately 630 nm.

The first resist layer 6R is disposed on the first light-emitting layer 5R. The first resist layer 6R preferably has a thickness equal to or greater than 1 nm and less than or equal to 50 nm, for example. In addition, the upper limit of the thickness of the first resist layer 6R is more preferably 40 nm or less, still more preferably 30 nm or less, and yet still more preferably 20 nm or less for the purpose of curbing an increase in drive voltage. When the first resist layer 6R remains as a permanent film and has the above-described thickness, deterioration in performance such as an increase in drive voltage of the light-emitting element can be suppressed, and carrier balance can be adjusted. The first resist layer 6R contains a cured product of a photosensitive resin composition, and may contain a functional material such as a first light-emitting material or a second charge transport material that transports a second charge, for example. When the first resist layer 6R contains the first light-emitting material, for example, the first resist layer 6R functions as a part of the first light-emitting layer 5R. In addition, when the first resist layer 6R contains the second charge transport material, for example, the first resist layer 6R functions as a part of the second charge transport layer 7. When the first resist layer 6R contains neither the first light-emitting material nor the second charge transport material, the first resist layer 6R preferably has a thickness equal to or greater than 5 nm and less than or equal to 30 nm to transport the second charge from the second electrode 8 to the first light-emitting layer 5R via the second charge transport layer 7. Note that the thickness of the first resist layer 6R is set in consideration of film loss or the like caused by subsequent development.

The second charge transport layer 7 is disposed on the first resist layer 6R. The second charge transport layer 7 transports the second charge injected from the second electrode 8 to the first light-emitting layer 5R. The second charge has polarity opposite to that of the first charge. Further, the second charge transport layer 7 may be composed of a single layer or multiple layers.

The second electrode 8 is disposed on the second charge transport layer 7. The second electrode 8 supplies, for example, the second charge to the first light-emitting layer 5R.

The first electrode 2R and the second electrode 8 are made of a conductive material such as, for example, a metal or a transparent conductive oxide. Examples of the metal described above include Al, Cu, Au, and Ag. Examples of the transparent conductive oxide described above include indium tin oxide (ITO), indium zinc oxide (IZO), zinc oxide (ZnO), aluminum zinc oxide (ZnO:Al (AZO)), and boron zinc oxide (ZnO:B (BZO)). Further, the first electrode 2R and the second electrode 8 may be, for example, a layered body including at least one metal layer and/or at least one transparent conductive oxide layer.

One of the first electrode 2R and the second electrode 8 is made of a light-transmissive material. Further, one of the first electrode 2R and the second electrode 8 may be formed of a light-reflective material. When the light-emitting element 100A is a top emission light-emitting element, for example, the second electrode 8, which is an upper layer, is formed of a light-transmissive material, and the first electrode 2R, which is a lower layer, is formed of a light-reflective material. In addition, when the light-emitting element 100A is a bottom emission light-emitting element, for example, the second electrode 8, which is an upper layer, is formed of a light-reflective material, and the first electrode 2R, which is a lower layer, is formed of a light-transmissive material. Furthermore, one of the first electrode 2R and the second electrode 8 may be an electrode with light reflectivity as a layered body made of a light-transmissive material and a light-reflective material.

A transparent conductive material can be used as a light-transmissive material, for example. Specifically, for example, indium tin oxide (ITO), indium zinc oxide (IZO), tin oxide ($SnO_2$), or fluorine-doped tin oxide (FTO) can be used as a light-transmissive material. Since these materials have a high transmittance with respect to visible light, luminous efficiency of the light-emitting element 100A is improved.

A metal material can be used as a light-reflective material, for example. Specifically, for example, aluminum (Al), silver (Ag), copper (Cu), or gold (Au) can be used as a light-reflective material. Since these materials have a high reflectivity with respect to visible light, luminous efficiency is improved.

Examples of the first light-emitting material include quantum dots. For example, quantum dots are semiconductor fine particles having a particle size equal to or less than 100 nm, and can include a group II-VI semiconductor compound such as MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe, and/or a crystal of a group III-V semiconductor compound such as GaAs, GaP, InN, InAs, InP, and InSb, and/or a crystal of a group IV semiconductor compound such as Si and Ge. Furthermore, quantum dots may have, for example, a core-shell structure in which such a semiconductor crystal described above is a core and a shell material having a high band gap is coated over the core.

Each of the first charge transport layer 4 and the second charge transport layer 7 may be a hole transport layer or an electron transport layer. For example, when the first electrode 2R is the anode electrode and the second electrode 8 is the cathode electrode, the first charges are positive holes, the second charges are electrons, the first charge transport layer 4 is a hole transport layer, and the second charge transport layer 7 is an electron transport layer. For example, when the first electrode 2R is the cathode electrode and the second electrode 8 is the anode electrode, the first charges are electrons, the second charges are positive holes, the first charge transport layer 4 is an electron transport layer, and the second charge transport layer 7 is a hole transport layer. For example, the hole transport layer and the electron transport layer may be single-layered or multilayered. When the hole transport layer is multilayered, an example thereof is a layered structure including a layer with a hole injection ability on the most anode electrode side. In addition, when the electron transport layer is multilayered, an example thereof is a layered structure including a layer with an electron injection ability on the most cathode electrode side.

Examples of a material forming the hole transport layer include materials containing one or more types selected from the group consisting of oxides, nitrides, or carbides containing at least one of Zn, Cr, Ni, Ti, Nb, Al, Si, Mg, Ta, Hf, Zr, Y, La, and Sr; materials such as 4,4',4"-tris(9-carbazoyl)triphenylamine (TCTA), 4,4'-bis[N-(1-naphthyl)-N-phenyl-amino]-biphenyl (NPB), zincphthalocyanine (ZnPC), di[4-(N,N-ditolylamino)phenyl]cyclohexane (TAPC), 4,4'-bis(carbazol-9-yl)biphenyl (CBP), 2,3,6,7,10, 11-hexacyano-1,4,5,8,9,12-hexaazatriphenylene (HATCN), and $MoO_3$; and hole transport organic materials such as poly(N-vinylcarbazole) (PVK), poly(2,7-(9,9-di-n-octylfluorene)-(1,4-phenylene-((4-sec-butylphenyl)imino)-1, 4-phenylene (TFB), a poly(triphenylamine) derivative (Poly-TPD), and poly(3,4-ethylenedioxythiophene)/poly(4-styrenesulfonate) (PEDOT-PSS). Only one type of these hole transport materials may be used, or two or more types thereof may be appropriately mixed and used.

As materials forming the electron transport layer, electron transport materials, for example, zinc oxide (e.g., ZnO), titanium oxide (e.g., $TIO_2$), and strontium oxide titanium (e.g., $SrTiO_3$) may be used. Only one type of these electron transport materials may be used, or two or more types thereof may be appropriately mixed and used.

The materials forming the hole transport layer and the electron transport layer are selected as appropriate according to the configuration and characteristics of the light-emitting element 100A.

Next, the second light-emitting element 10G will be described.

The second light-emitting element 10G has a configuration similar to that of the first light-emitting element 10R. However, they are different in that the first light-emitting layer 5R is changed to a first light-emitting layer 5G.

The first light-emitting layer 5G has a light-emitting central wavelength at the second wavelength and emits light at, for example, approximately 530 nm. The first light-emitting layer 5G contains a second light-emitting material that has a light-emitting central wavelength at the second wavelength and that emits light at, for example, approximately 530 nm.

Examples of the second light-emitting material include quantum dots. The quantum dots are similar to those of the first light-emitting material, but has a light-emitting central wavelength at the second wavelength.

Next, a third light-emitting element 10B will be described.

The third light-emitting element 10B has a configuration similar to that of the first light-emitting element 10R. However, they are different in that the first light-emitting layer 5R is changed to a first light-emitting layer 5B.

The first light-emitting layer 5B has a light-emitting central wavelength at the third wavelength and emits light at, for example, approximately 440 nm. For example, the first light-emitting layer 5B contains a third light-emitting material that has a light-emitting central wavelength at the third wavelength and that emits light at, for example, approximately 440 nm.

Examples of the third light-emitting material include quantum dots. The quantum dots are similar to those of the first light-emitting material, but have a light-emitting central wavelength at the third wavelength.

Furthermore, in the light-emitting element 100A, banks 3 are provided isolating the light-emitting elements of the respective colors from each other. Each bank 3 is formed of, for example, resin having insulating properties such as polyimide and acrylic resins.

Further, in the light-emitting element 100A, the first charge transport layer 4, the second charge transport layer 7, and the second electrode 8 are formed as common layers. However, this does not have to be the case, and the first charge transport layer 4, the second charge transport layer 7, and the second electrode 8 may be divided to be separate for each light-emitting element of the respective colors.

In addition, in the light-emitting element 100A, the first light-emitting layer 5R and the first resist layer 6R overlap the first light-emitting layer 5G and the first resist layer 6G, the first light-emitting layer 5G and the first resist layer 6G overlap the first light-emitting layer 5B and the first resist layer 6B, and the first light-emitting layer 5B and the first resist layer 6B overlap the first light-emitting layer 5R and the first resist layer 6R over the banks 3. Since the layers overlap each other in this manner, the insulation between the second electrode 8 formed over the banks 3 and the first electrodes 2R, 2G, and 2B is increased, so that the leakage current can be curbed. Further, each layer to be provided on or over the banks 3 need not be formed. Further, each of the first light-emitting layers 5R, 5G, and 5B and the first resist layers 6R, 6G, and 6B is patterned.

Next, an example of a method for manufacturing the light-emitting element 100A according to the present embodiment will be described with reference to FIGS. 1 and 2A to 2I.

Figure 2A:
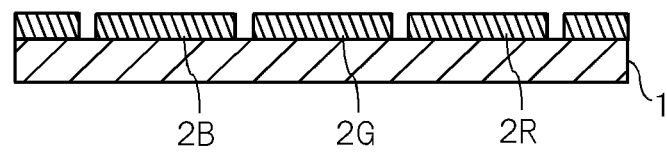
FIG. 2A is a view for describing a step in an example of a method for manufacturing a light-emitting element according to the first embodiment.

First, the first electrodes 2R, 2G, and 2B are formed on the substrate 1 as illustrated in FIG. 2A (S1). The first electrodes 2R, 2G, and 2B can be formed using any of various known methods, for example, a sputtering method or a vacuum vapor deposition technique.

Figure 2B:
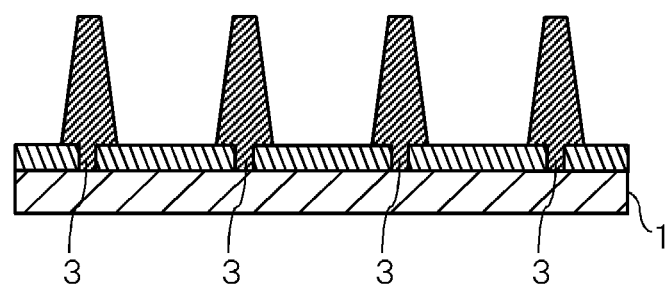
FIG. 2B is a view for describing a step in the example of the method for manufacturing the light-emitting element according to the first embodiment.

Next, the banks 3 are formed with the first electrodes 2R, 2G, and 2B separated from each other as illustrated in FIG. 2B (S2). The banks 3 can be formed by, for example, applying a liquid resin on the entire surface and then patterning the resin.

Figure 2C:
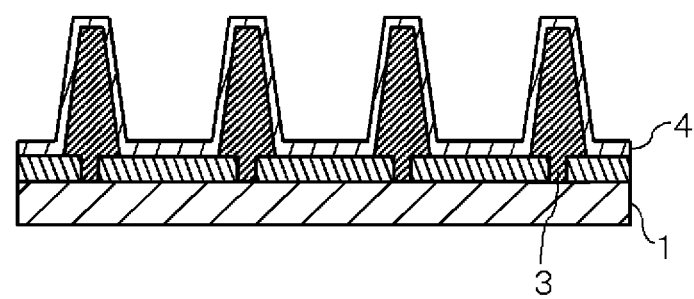
FIG. 2C is a view for describing a step in the example of the method for manufacturing the light-emitting element according to the first embodiment.

Next, the first charge transport layer 4 is formed on the first electrodes 2R, 2G, and 2B as illustrated in FIG. 2C (S3). The first charge transport layer 4 can be formed using any of various known methods, for example, vacuum vapor deposition, sputtering, or an application method. Although the first charge transport layer 4 is also formed on the banks 3 in the present embodiment, the first charge transport layer 4 may be patterned corresponding to each of the first electrodes 2R, 2G, and 2B without being formed on the banks 3.

Figure 2D:
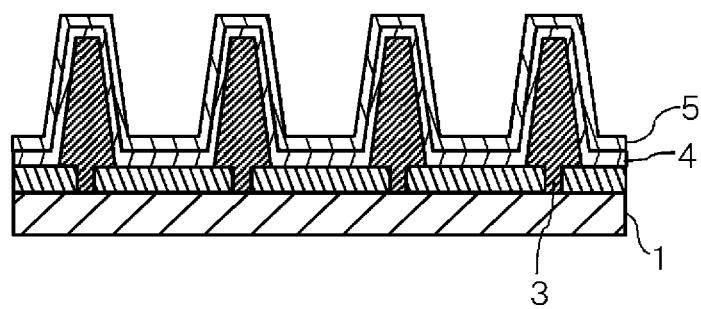
FIG. 2D is a view for describing a step in the example of the method for manufacturing the light-emitting element according to the first embodiment.

Next, the first light-emitting layer 5 is formed on the first charge transport layer 4 as illustrated in FIG. 2D (S4: first light-emitting layer forming step). The first light-emitting layer 5 can be formed by, for example, applying a colloidal solution (first quantum dot solution) of quantum dots (first quantum dots) that emit red light onto the entire surface and firing the applied colloidal solution.

Figure 2E:
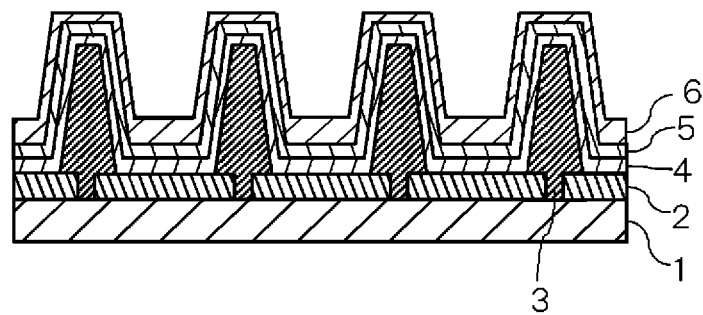
FIG. 2E is a view for describing a step in the example of the method for manufacturing the light-emitting element according to the first embodiment.

Next, the first resist layer 6 is formed on the first light-emitting layer 5 as illustrated in FIG. 2E (S5: first resist layer forming step). The first resist layer 6 can be formed by, for example, applying a solution of a photosensitive resin composition onto the entire surface and firing the applied solution. Although a positive photosensitive resin composition is used as a photosensitive resin composition in the present embodiment, the photosensitive resin composition may be a negative photosensitive resin composition. Examples of such a photosensitive resin composition include those containing a resin component such as an acrylic resin, a phenolic resin such as a novolac resin, a rubber-based resin, a styrene-based resin, or an epoxy-based resin, a photosensitizer, or a solvent. Furthermore, the photosensitive resin composition may further contain the first light-emitting material or a functional material such as a charge transport material. The functional material is preferably functional particles formed in particles, and the functional particles are preferably nanoparticles. Examples of such nanoparticles include quantum dots and charge transport nanoparticles. Further, quantum dots contained in the photosensitive resin composition are referred to as second quantum dots. The second quantum dots may be the same as or different from the first quantum dots. In addition, examples of charge transport nanoparticles include hole transport nanoparticles such as NiO, CuI, $Cu_2O$, CoO, $Cr_2O_3$, and $CuAlS_2$, and electron transport nanoparticles such as ZnO, ZnS, ZrO, MgZnO, AlZnO, and $TiO_2$. These nanoparticles may be of one kind or a mixture of a plurality of kinds, or a mixed crystal of a plurality of kinds. Further, as a solvent, a solvent in which the first light-emitting layer 5 does not easily dissolve is preferably selected, and for example, one different from the solvent in the first quantum dot solution is preferred. Furthermore, the quantum dots may be modified with a ligand having a functional group including, for example, a carboxylate group, a phosphate group, a thiolate group, an amino group, a thiol group, a phosphine group, or a phosphine oxide group.

Figure 2F:
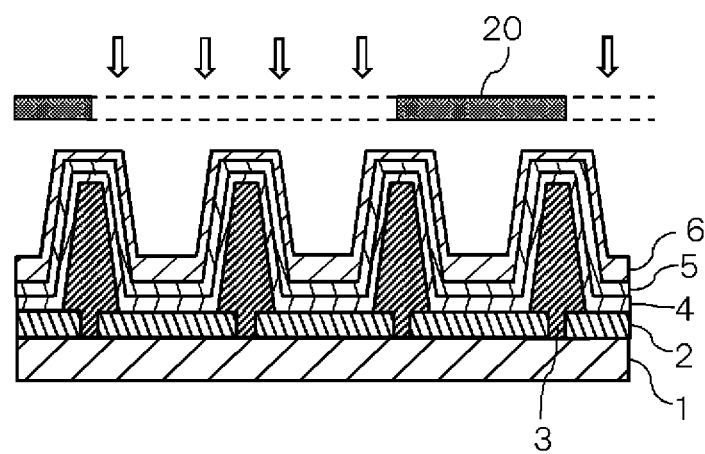
FIG. 2F is a view for describing a step in the example of the method for manufacturing the light-emitting element according to the first embodiment.

Next, the first resist layer 6 is exposed to light using, for example, a mask 20 having a predetermined pattern as illustrated in FIG. 2F (S6: exposure step). The mask 20 has a pattern in which the region corresponding to the first light-emitting element of the first resist layer 6 remains due to subsequent development. Since the first resist layer 6 is formed of a positive photosensitive resin composition in the present embodiment, the pattern is formed in which the region other than the region corresponding to the first light-emitting element is exposed. Further, when the first resist layer 6 is formed of a negative photosensitive resin composition, the mask 20 may have a pattern in which the region corresponding to the first light-emitting element is exposed, contrary to the positive photosensitive resin composition.

Figure 2G:
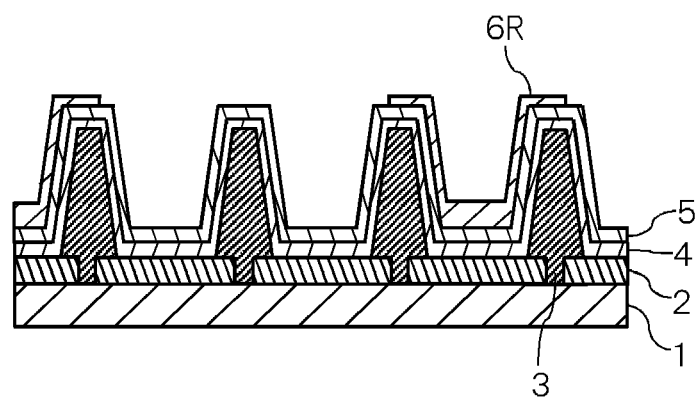
FIG. 2G is a view for describing a step in the example of the method for manufacturing the light-emitting element according to the first embodiment.

Next, the first resist layer 6 is developed with a developing solution to pattern the first resist layer 6 into the first resist layer 6R as illustrated in FIG. 2G (S7).

Figure 2H:
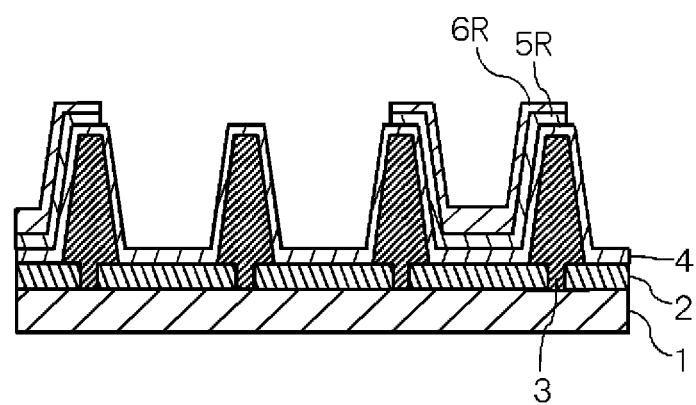
FIG. 2H is a view for describing a step in the example of the method for manufacturing the light-emitting element according to the first embodiment.

Next, processing with a treatment liquid is performed using the patterned first resist layer 6R as a mask, whereby the first light-emitting layer 5 is patterned into the first light-emitting layer 5R as illustrated in FIG. 2H (S8: pattern forming step). Here, when steps S7 and S8 are consolidated into one step with the first light-emitting layer 5 and the first resist layer 6 developed in the same step using the developing solution for developing the first resist layer 6 as the treatment liquid, the entire steps can be simplified. In this case, the developing solution preferably contains a surfactant. When the developing solution contains a surfactant, the first light-emitting layer 5 can be more easily patterned into the first light-emitting layer 5R. In addition, by patterning the first light-emitting layer 5 using the first resist layer 6R as a mask, the light-emitting region of the first light-emitting layer 5R is prevented from being directly exposed to the treatment liquid. This reduces the possibility of the light-emitting region of the first light-emitting layer 5R being damaged by the processing with the treatment liquid. After the patterning into the first light-emitting layer 5R, for example, washing with water and air drying are further performed, followed by hard baking.

Figure 2I:
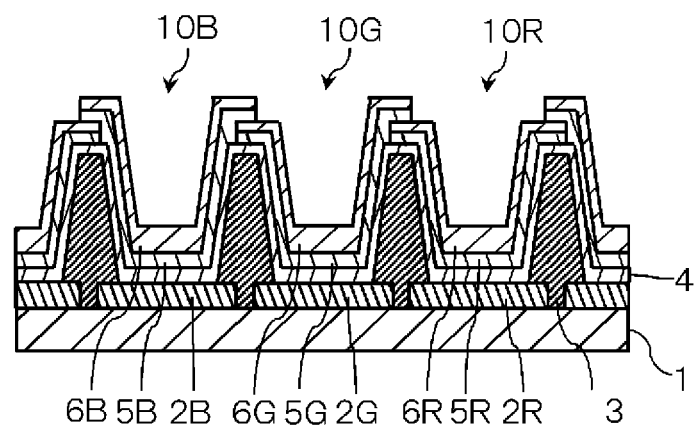
FIG. 2I is a view for describing a step in the example of the method for manufacturing the light-emitting element according to the first embodiment.

Next, by repeating the steps S4 to S8, the first light-emitting layer (second first light-emitting layer) 5G and the first resist layer 6G corresponding to the second light-emitting element 10G, and the first light-emitting layer (third first light-emitting layer) 5B and the first resist layer 6B corresponding to the third light-emitting element 10B are formed as illustrated in FIG. 2I (S9). Further, when the first light-emitting layer 5G is formed, the first light-emitting layer may be formed using a colloidal solution of quantum dots (second first quantum dots) that emit green light, in place of the first light-emitting layer 5 in 55. In addition, when the first light-emitting layer 5B is formed, the first light-emitting layer may be formed using a colloidal solution of quantum dots (third first quantum dots) that emit blue light, in place of the first light-emitting layer 5 in S5. Furthermore, the first resist layer 6G and the first resist layer 6B may be the same as or different from the first resist layer 6R as long as they are formed of a photosensitive resin composition.

Figure 2J:
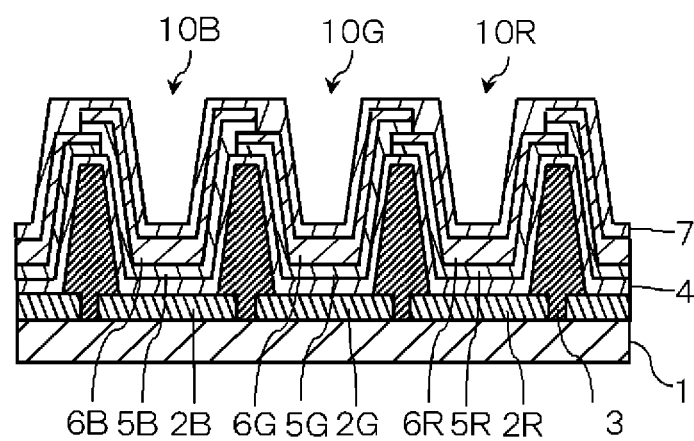
FIG. 2J is a view for describing a step in the example of the method for manufacturing the light-emitting element according to the first embodiment.

Next, the second charge transport layer 7 is formed on the first resist layer 6R, the first resist layer 6G, and the first resist layer 6B as illustrated in FIG. 2J (S10). The second charge transport layer 7 can be formed using any of various known methods, for example, vacuum vapor deposition, sputtering, or an application method. The second charge transport layer 7 may be patterned corresponding to the light-emitting element of each color. Further, the second charge transport layer 7 corresponds to the first function layer.

Next, the second electrode 8 is formed on the second charge transport layer 7 (S11). The second electrode 8 can be formed using any of various known methods, for example, a sputtering method or a vacuum vapor deposition technique.

The light-emitting element 100A illustrated in FIG. 1 can be manufactured in the above-described manner.

Although the first light-emitting element 10R, the second light-emitting element and the third light-emitting element 10B are manufactured in similar steps in the above description, this does not have to be the case. For example, the light-emitting layer, the charge transport layer, and the like of one or two of the first light-emitting element the second light-emitting element 10G, and the third light-emitting element 10B may be formed in an inkjet method.

According to the method for manufacturing a light-emitting element of the present embodiment, the first resist layer is a permanent film, and thus the step of removing the same can be omitted.

Figure 3:
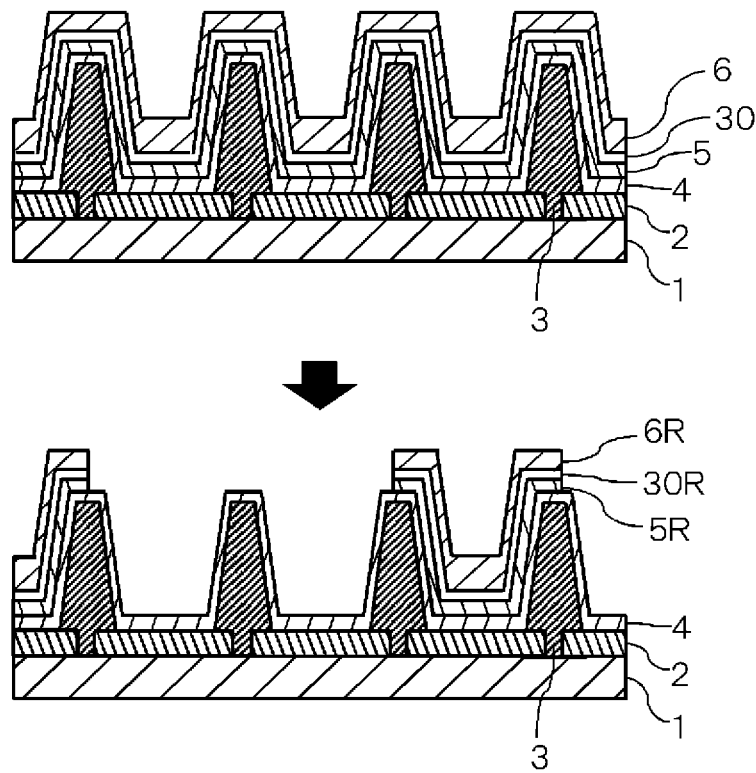
FIG. 3 is a view for describing a modified example of the method for manufacturing the light-emitting element according to the first embodiment.

In addition, as a modified example, at least one second function layer 30 may be formed on the first light-emitting layer 5 formed in S4, and then the steps S5 to S7 may be performed to pattern the at least one second function layer 30 into at least one second function layer 30R, for example, as illustrated in FIG. 3. In this case, at least one second function layer 30 is formed of a material that can be patterned when processed with the treatment liquid. Examples of such a material include oxides having, as a main composition, an amphoteric metal such as ZnO, AlZnO, LiZnO, or MgZnO. The second function layer 30 corresponds to the second charge transport layer 7.

In addition, although the first light-emitting layer 5 is patterned in S8 described above, the first charge transport layer 4 may be further patterned by processing the first charge transport layer 4 with the treatment liquid using the patterned first resist layer 6R as a mask. Further, the first charge transport layer 4 is formed of a material that can be patterned by being processed with the treatment liquid. Examples of such a material include oxides having, as a main composition, an amphoteric metal such as ZnO, AlZnO, LiZnO, or MgZnO. The first charge transport layer 4 corresponds to a function layer. The function layer may be a single layer or a plurality of layers, all of which are formed of patternable materials.

Second Embodiment

An example of a light-emitting element 100B and a method for manufacturing the light-emitting element according to the present embodiment will be described with reference to FIGS. 4A to 4I. Further, description of steps and reference signs similar to those of the first embodiment will be omitted.

S1 to S3 are similar to those of the first embodiment.

Figure 4A:
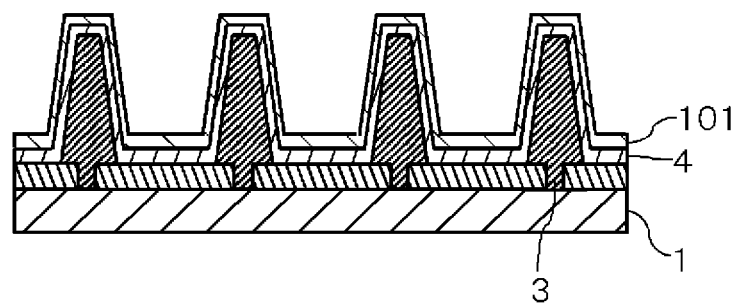
FIG. 4A is a view for describing a step in an example of a method for manufacturing a light-emitting element according to a second embodiment.

Next, a lift-off resist layer 101 is formed on the first charge transport layer 4 as illustrated in FIG. 4A (S21). The lift-off resist layer 101 can be formed by, for example, applying a positive photosensitive resin composition onto the entire surface and firing the applied positive photosensitive resin composition.

Figure 4B:
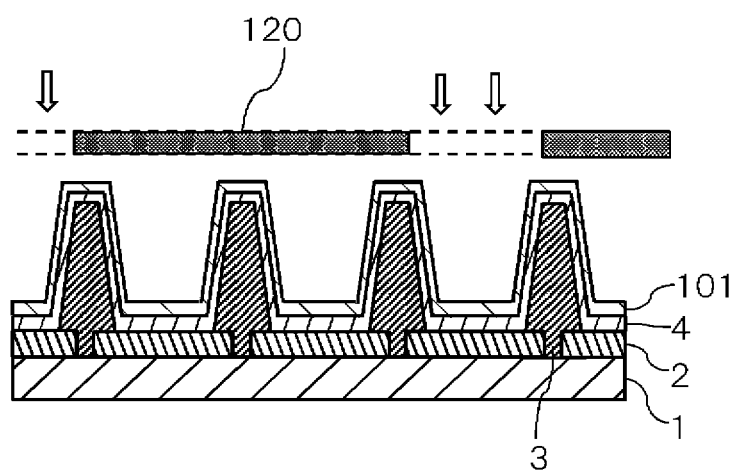
FIG. 4B is a view for describing a step in the example of the method for manufacturing the light-emitting element according to the second embodiment.

Next, the lift-off resist layer 101 is exposed to light using, for example, a mask 120 with a predetermined pattern as illustrated in FIG. 4B (S22). The mask 120 has a pattern in which a region other than the region corresponding to the first light-emitting element in the lift-off resist layer 101 remains due to following development.

Figure 4C:
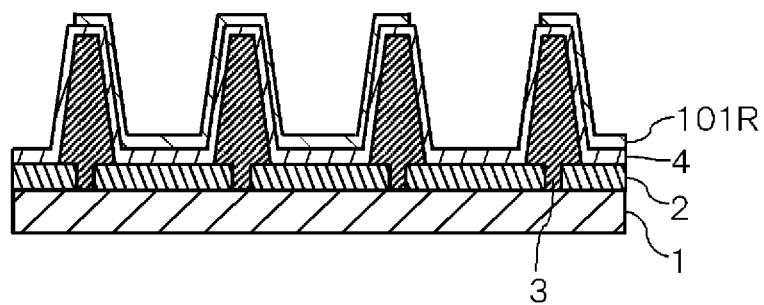
FIG. 4C is a view for describing a step in the example of the method for manufacturing the light-emitting element according to the second embodiment.
Figure 4D:
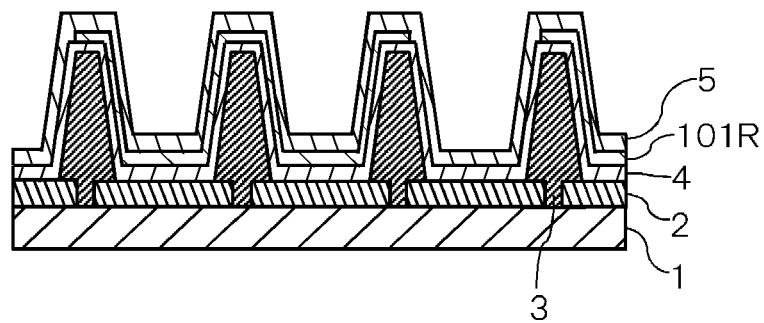
FIG. 4D is a view for describing a step in the example of the method for manufacturing the light-emitting element according to the second embodiment.
Figure 4E:
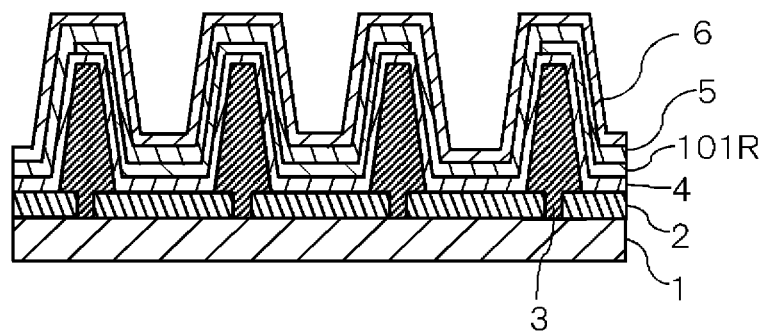
FIG. 4E is a view for describing a step in the example of the method for manufacturing the light-emitting element according to the second embodiment.

Next, the lift-off resist layer 101 is developed with, for example, a developing solution to pattern the lift-off resist layer 101 into a lift-off pattern 101R as illustrated in FIG. 4C (S23).

Next, the first light-emitting layer 5 is formed on the first charge transport layer 4 on which the lift-off pattern 101R has been formed, for example, in the same manner as in S4 described above as illustrated in FIG. 4D (S24).

Next, the first resist layer 6 is formed on the first light-emitting layer 5, for example, in the same manner as in S5 described above as illustrated in FIG. 4E (S25). Further, in this step, a negative photosensitive resin composition is used as a photosensitive resin composition for forming the first resist layer 6.

Figure 4F:
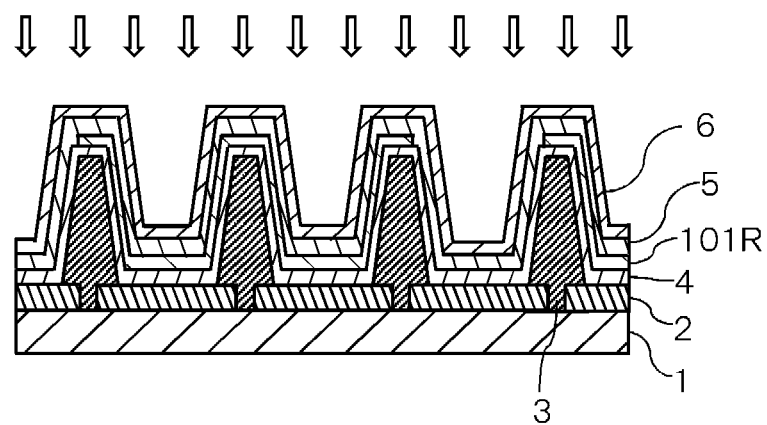
FIG. 4F is a view for describing a step in the example of the method for manufacturing the light-emitting element according to the second embodiment.

Next, the entire surface is exposed to light, for example, as illustrated in FIG. 4F (S26). With this exposure of the entire surface, the first resist layer 6 is cured because it is formed of a negative photosensitive resin composition, and becomes insoluble in a developing solution. On the other hand, since it is formed of a positive photosensitive resin composition, the lift-off pattern 101R is soluble in the developing solution.

Figure 4G:
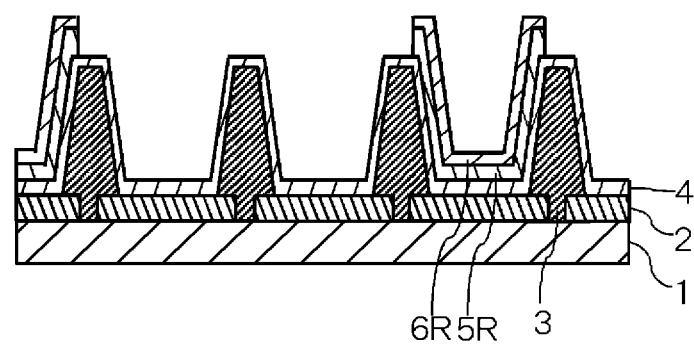
FIG. 4G is a view for describing a step in the example of the method for manufacturing the light-emitting element according to the second embodiment.

Next, the first light-emitting layer 5 and the first resist layer 6 in the region formed on the lift-off pattern 101R are lifted off together with the lift-off pattern 101R after being processed with, for example, a developing solution as illustrated in FIG. 4G (S27). With this lift-off, the patterned first light-emitting layer 5R and first resist layer 6R can be formed in the region corresponding to the first light-emitting element. Further, in this step, since the first light-emitting layer 5R in the region corresponding to the first light-emitting element is protected by the cured first resist layer 6R, the first light-emitting layer is less likely to be damaged by the processing with the developing solution.

Figure 4H:
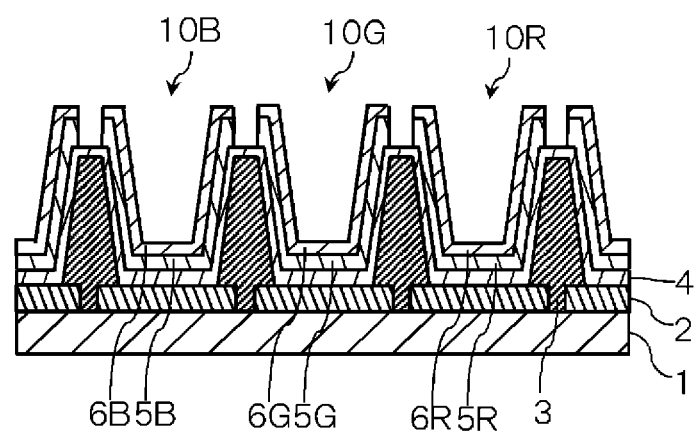
FIG. 4H is a view for describing a step in the example of the method for manufacturing the light-emitting element according to the second embodiment.
Figure 4I:
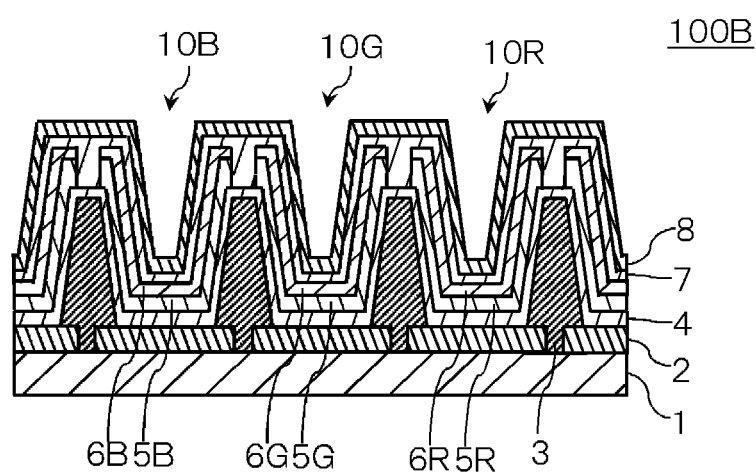
FIG. 4I is a view schematically illustrating an example of a layered structure of the light-emitting element according to the second embodiment.

Next, by repeating S24 to S27, for example, the first light-emitting layer 5G and the first resist layer 6G corresponding to the second light-emitting element 10G, and the first light-emitting layer 5B and the first resist layer 6B corresponding to the third light-emitting element 10B are formed as illustrated in FIG. 4H (S28).

Next, the second charge transport layer 7 is formed in the same manner as, for example, in S10 described above, and the second electrode 8 is formed in the same manner as in S11 described above as illustrated in FIG. 4I (S29). The light-emitting element 100B can be manufactured in the above-described manner.

According to the method for manufacturing a light-emitting element in the present embodiment, the first light-emitting layers 5R, 5G, and 5B are protected by the first resist layers 6R, 6G, and 6B. Thus, peeling and film loss of the light-emitting layers 5R, 5G, and 5B during development or the like can be curbed.

Further, although the second charge transport layer 7 is formed in S28 in the present embodiment, the second charge transport layer 7 may be formed on the lift-off pattern 101R, for example, on the entire surface of the lift-off pattern 101R, before processing with a developing solution in S27, and the second charge transport layer 7 may be patterned such that only the region thereof corresponding to the first light-emitting element remains by partially lifting off the layer when the lift-off pattern 101R is removed in the processing with the developing solution. As a result, since the charge transport layer is divided to be separate for each pixel, current leakage is curbed, and improvement in characteristics of the light-emitting element, such as improvement in luminous efficiency and prevention of crosstalk, can be achieved. Furthermore, another layer may be formed and this another layer may be patterned in the same manner as with the patterned second charge transport layer 7.

The disclosure is not limited to the embodiments described above, and may be substituted with a configuration that is substantially the same as the configuration described in the embodiments described above, a configuration that achieves the same action and effect, or a configuration capable of achieving the same object.

The invention claimed is:

1. A method for manufacturing a light-emitting element, the method comprising:
    forming a first light-emitting layer by applying a first quantum dot solution containing first quantum dots;
    forming a first resist layer by applying a first photosensitive resin composition onto the first light-emitting layer;
    exposing the first resist layer to light in a predetermined pattern; and
    performing a pattern formation of developing the first resist layer with a developing solution to form a patterned first resist layer, and processing the first light-emitting layer with a treatment liquid using the patterned first resist layer as a mask to form a patterned first light-emitting layer.

2. The method for manufacturing a light-emitting element according to claim 1,
    wherein the treatment liquid is the developing solution.

3. The method for manufacturing a light-emitting element according to claim 2,
    wherein the developing solution contains a surfactant.

4. The method for manufacturing a light-emitting element according to claim 1,
    wherein the first photosensitive resin composition is a positive photosensitive resin composition,
    the method further includes forming at least one first function layer on the patterned first resist layer, and
    when the first resist layer is patterned in the pattern formation, the at least one first function layer is lifted off to form at least one patterned first function layer.

5. The method for manufacturing a light-emitting element according to claim 1,
    wherein the first photosensitive resin composition contains a functional material.

6. The method for manufacturing a light-emitting element according to claim 5,
    wherein the functional material contains second quantum dots.

7. The method for manufacturing a light-emitting element according to claim 5,
    wherein the functional material contains charge transport nanoparticles.

8. The method for manufacturing a light-emitting element according to claim 1, the method further comprising
    baking and curing the patterned first resist layer.

9. The method for manufacturing a light-emitting element according to claim 8,
    wherein a second first light-emitting layer containing second first quantum dots having a light emission color different from that of the first quantum dots is formed on the baked first resist layer and then the forming of the first resist layer, the exposing, and the pattern formation are further performed.

10. The method for manufacturing a light-emitting element according to claim 1, the method further comprising
    forming at least one second function layer on the first light-emitting layer before forming the first resist layer,
    wherein the at least one second function layer is processed with a treatment liquid using the patterned first resist layer as a mask to be patterned in the pattern formation.

11. A method for manufacturing a light-emitting element, the method comprising:
    forming a lift-off resist layer by applying a positive photosensitive resin composition;
    exposing the lift-off resist layer to light in a predetermined pattern;
    developing the lift-off resist layer to form a patterned lift-off resist layer;
    applying a first quantum dot solution containing first quantum dots onto the patterned lift-off resist layer to form a first light-emitting layer;
    applying a negative photosensitive resin composition onto the first light-emitting layer to form a first resist layer; and
    performing a pattern formation of exposing an entire surface of the first resist layer to light, and then lifting off the first light-emitting layer and the first resist layer formed on the patterned lift-off resist layer by processing the patterned lift-off resist layer with a developing solution to pattern the first light-emitting layer and the first resist layer.

12. The method for manufacturing a light-emitting element according to claim 11, the method further comprising
    forming at least one first function layer on the first resist layer,
    wherein, when the patterned lift-off resist layer is processed with the developing solution in the pattern formation, the at least one first function layer formed on the patterned lift-off resist layer is lifted off to pattern the at least one first function layer.

13. The method for manufacturing a light-emitting element according to claim 11, the method further comprising
    forming at least one second function layer at a position on the patterned lift-off resist layer and under the first light-emitting layer,
    wherein, when the patterned lift-off resist layer is processed with the developing solution in the pattern formation, the at least one second function layer formed on the patterned lift-off resist layer is lifted off to pattern the at least one second function layer.

\* \* \* \* \*